(12) United States Patent
Reichard

(10) Patent No.: US 6,787,939 B2
(45) Date of Patent: Sep. 7, 2004

(54) ELECTRONIC MODULE INTERCONNECT SYSTEM

(75) Inventor: Jeffrey A. Reichard, Oconomowoc, WI (US)

(73) Assignee: American Superconductor Corporation, Westborough, MA (US)

( * ) Notice: Subject to any disclaimer, the term of this patent is extended or adjusted under 35 U.S.C. 154(b) by 508 days.

(21) Appl. No.: 09/966,330

(22) Filed: Sep. 27, 2001

(65) Prior Publication Data

US 2003/0057779 A1 Mar. 27, 2003

(51) Int. Cl.[7] ................................................. H02J 7/00
(52) U.S. Cl. .................................................... 307/150
(58) Field of Search ........................ 307/150, 42; 710/8, 710/100, 300, 305, 313

(56) References Cited

U.S. PATENT DOCUMENTS 4,791,662 A * 12/1988 Ahnen et al. ................ 379/158
6,405,330 B1 * 6/2002 Hanf et al. ................... 714/712
6,624,532 B1 * 9/2003 Davidow et al. .............. 307/39
6,683,392 B2 * 1/2004 Reinhardt et al. ........... 307/113

* cited by examiner

Primary Examiner—Gregory J. Toatley, Jr.
(74) Attorney, Agent, or Firm—Fish & Richardson P.C.

(57) ABSTRACT

An interconnection system for providing signals to a number of independently controllable or selectable electronic modules includes first connection terminals associated with each and every one of the electronic modules and second connection terminals associated with each of the electronic modules except a first one of the electronic modules. The second connection terminals are electrically connected to the first connection terminals. For example, a system can include independently controllable electronic module, a first one of the independently controllable electronic modules including first connection terminals and second connection terminals, which are associated with all but one of the independently controllable electronic modules and are electrically connected to the first connection terminals.

17 Claims, 3 Drawing Sheets

| 22b | | | | | | | | | | | | | | | | | | | | | | |
|---|---|---|---|---|---|---|---|---|---|---|---|---|---|---|---|---|---|---|---|---|---|---|
| On2+ | On2- | On3+ | On3- | On4+ | On4- | N/c | N/c | Ifb2 | Ifb3 | Ifb4 | N/c | N/c | Vfb2 | Vfb3 | Vfb4 | N/c | Temp2 | Temp3 | Temp4 | N/c | Vps | Prch | Gnd | Gnd |

| 24b | | | | | | | | | | | | | | | | | | | |
|---|---|---|---|---|---|---|---|---|---|---|---|---|---|---|---|---|---|---|---|
| On3+ | On3- | On4+ | On4- | N/c | N/c | N/c | Ifb3 | Ifb4 | N/c | N/c | Vfb3 | Vfb4 | N/c | N/c | Temp3 | Temp4 | N/c | N/c | Vps | Prch | Gnd | Gnd |

FIG. 3A

| 22c | | | | | | | | | | | | | | | | | | | |
|---|---|---|---|---|---|---|---|---|---|---|---|---|---|---|---|---|---|---|---|
| On3+ | On3- | On4+ | On4- | N/c | N/c | N/c | Ifb3 | Ifb4 | N/c | N/c | Vfb3 | Vfb4 | N/c | N/c | Temp3 | Temp4 | N/c | N/c | Vps | Prch | Gnd | Gnd |

| 24c | | | | | | | | | | | | | | | | | | |
|---|---|---|---|---|---|---|---|---|---|---|---|---|---|---|---|---|---|---|
| On4+ | On4- | N/c | N/c | N/c | N/c | N/c | N/c | Ifb4 | N/c | N/c | N/c | Vfb4 | N/c | N/c | Temp4 | N/c | N/c | Vps | Prch | Gnd | Gnd |

FIG. 3B

ELECTRONIC MODULE INTERCONNECT SYSTEM

BACKGROUND

The invention relates to systems for interconnecting electronic modules or poles (e.g., power converters).

Power converter systems, particularly those that provide large levels of power (e.g., >1 Mwatt), are often assembled in the form of one or more groups or banks of lower power level converter modules. The level of power supplied by such systems is roughly the aggregate of the power provided by each of the power converter modules. Assembling a power converter system as a set of power converter modules has maintenance and reliability advantages. In particular, if a power converter module fails, the power converter system continues to operate (albeit at a lower power level) while the defective power converter module can be replaced or "hot-swapped."

SUMMARY

The invention relates to a system, for example an interconnection system, for providing signals to a number of independently controllable or selectable electronic modules.

In a general aspect of the invention, the interconnection system includes a first plurality of connection terminals associated with each and every one of the plurality of electronic modules and a second plurality of connection terminals associated with the plurality of electronic modules except a first one of the electronic modules.

In another aspect of the invention, the interconnection system includes a substrate having first connection terminals associated with each and every one of the independently controllable electronic modules; second connection terminals associated with the independently controllable electronic modules except a first one of the electronic modules.

In still another aspect of the invention, the interconnection system for providing signals to independently controllable electronic modules, including a first substrate associated with a first one of the independently controllable electronic modules. The first substrate includes first connection terminals for receiving control signals to control each and every one of the independently controllable electronic modules and second connection terminals for receiving control signals to control each of the independently controllable electronic modules except a first one of the electronic modules.

In yet another aspect of the invention, a system includes independently controllable electronic modules, a first one of the modules including first and second connection terminals, the second connection terminals associated with all but one of the independently controllable electronic modules and electrically connected to the first connection terminals.

Embodiments of these aspects of the invention may include one or more of the following features.

Conductive traces extend between the second connection terminals and the first connection terminals. The second plurality of connection terminals are electrically connected to the first plurality of connection terminals. The interconnection system further includes a third plurality of connection terminals associated with each of the plurality of electronic modules except the first electronic module and the second electronic module. The interconnection system further includes a fourth plurality of connection terminals associated with the plurality of electronic modules except the first one of the electronic modules, the second one of the electronic modules, and the third one of the electronic modules.

The first plurality of connection terminals includes a first subset of connection terminals associated with a first one of the electronic modules and positioned at a first location on the first plurality of connection terminals. The second plurality of connection terminals includes a second subset of connection terminals associated with the first one of the electronic modules and positioned at a second location on the second plurality of connection terminals, corresponding to the first location on the first plurality of connection terminals, the second subset of connection terminals electrically connected to the first subset of connection terminals.

The first plurality of connection terminals includes a third subset of connection terminals associated with a second one of the electronic modules positioned at a third location on the first plurality of connection terminals. The second plurality of connection terminals includes a fourth subset of connection terminals associated with the second one of the electronic modules and positioned at a fourth location on the second plurality of connection terminals corresponding to the third location on the first plurality of connection terminals, the fourth subset of connection terminals electrically connected to the third subset of connection terminals.

The first plurality of connection terminals and the second plurality of connection terminals include connection terminals associated with a common ground signal, a precharge control signal and a logic power control signal. Each of the first plurality of connection terminals of the second plurality of connection terminals includes an upper gate signal (On+), a lower gate signal (On−), a current feedback signal (Ifb), a voltage feedback signal (Vfb), and a temperature signal (Temp) associated with the first one of the electronic modules and the second one of the electronic modules, respectively.

In another aspect of the invention, the interconnection system includes a substrate having first connection terminals associated with each and every one of the independently controllable electronic modules; second connection terminals associated with the independently controllable electronic modules except a first one of the electronic modules. The substrate also has conductive traces extending between the second connection terminals and the first connection terminals.

In yet another aspect of the invention, a system for distributing control signals from a controller includes a chain of sequentially-connected independently controllable electronic modules, an initial one of the electronic modules including first connection terminals adapted to receive the control signals from the controller, and a sequential one of the electronic modules including second connection terminals configured to receive only a subset of the control signals. In one embodiment of this aspect of the invention, the subset of the control signals received by the second connection terminals include control signals for all but one of the independently controllable electronic modules.

With this arrangement, control signals are provided to a bank of independently controllable or selectable electronic modules (e.g., power converter modules) in a systematic and reliable manner. Although the control signals required by the electronic modules are not the same, the interconnection system advantageously allows for the use of identical connectors and cabling for electrically connecting the individual electronic modules. Thus, the need for custom-made cables or auxiliary hardware (e.g., "jumpers") for physically configuring the distribution of the control signals is eliminated. For example, there is no risk of using the wrong connector or cable. Using identical connectors and cabling increases reliability and reduces the cost of the overall system.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 3A and 3B are schematic representations of connectors used for distributing the control signals required to operate the power supply system of FIG. 1.

DETAILED DESCRIPTION

Figure 1:
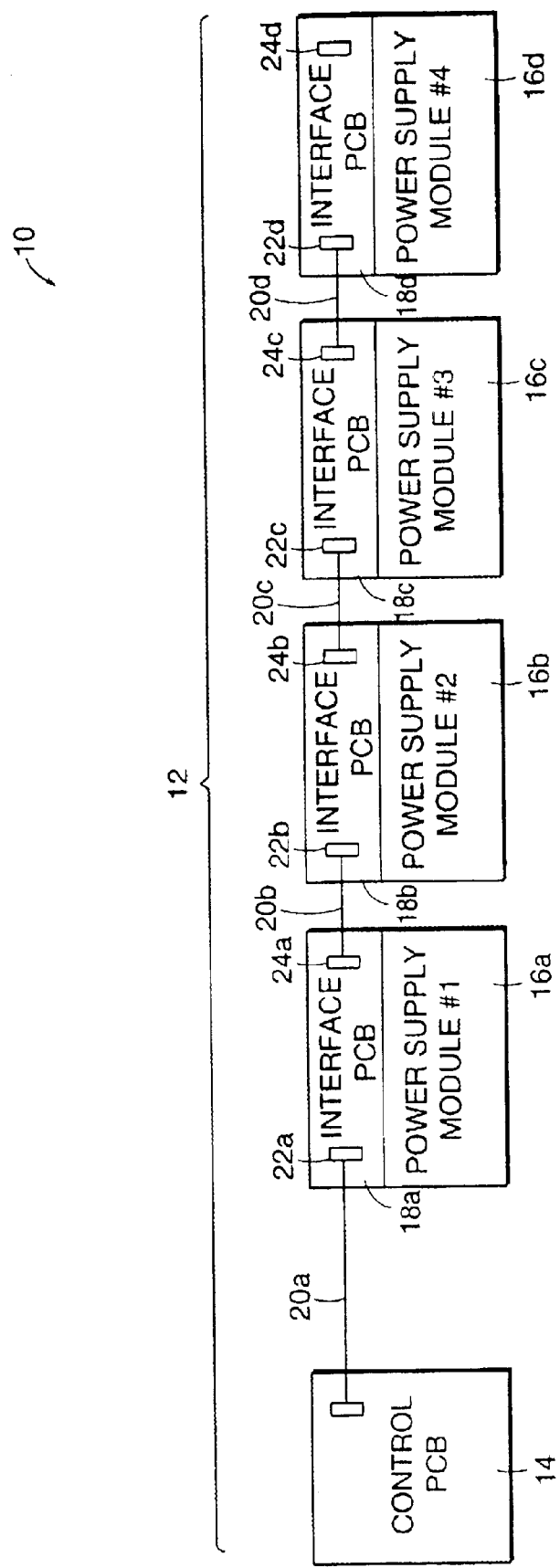
FIG. 1 is a block diagram of a power supply system having the power interconnection system in accordance with the invention.

Referring to FIG. 1, a power converter system 10 includes a power interconnection system 12 for distributing control signals from a control printed circuit board (PCB) 14 to a bank of four power converter modules 16a–16d. Each of the four power converter modules 16a–16d includes a corresponding interface PCB 18a–18d through which the modules receive the control signals. Each interface PCB 18a–18d typically includes circuitry for providing data signals to, for example, an external data storage. Power interconnection system 12 includes identical cables 20a–20d for interconnecting power converter modules 16a–16d in daisy-chain fashion. That is, cable 20a connects control PCB 14 to power converter module 16a, cable 20b connects power converter module 16a to power converter module 16b, cable 20c connects power converter module 16b to power converter module 16c, and cable 20d connects power converter module 16c to power converter module 16d. Each interface PCB 18a–18d includes identical input connectors 22a–22d and output connectors 24a–24d.

Figure 2:
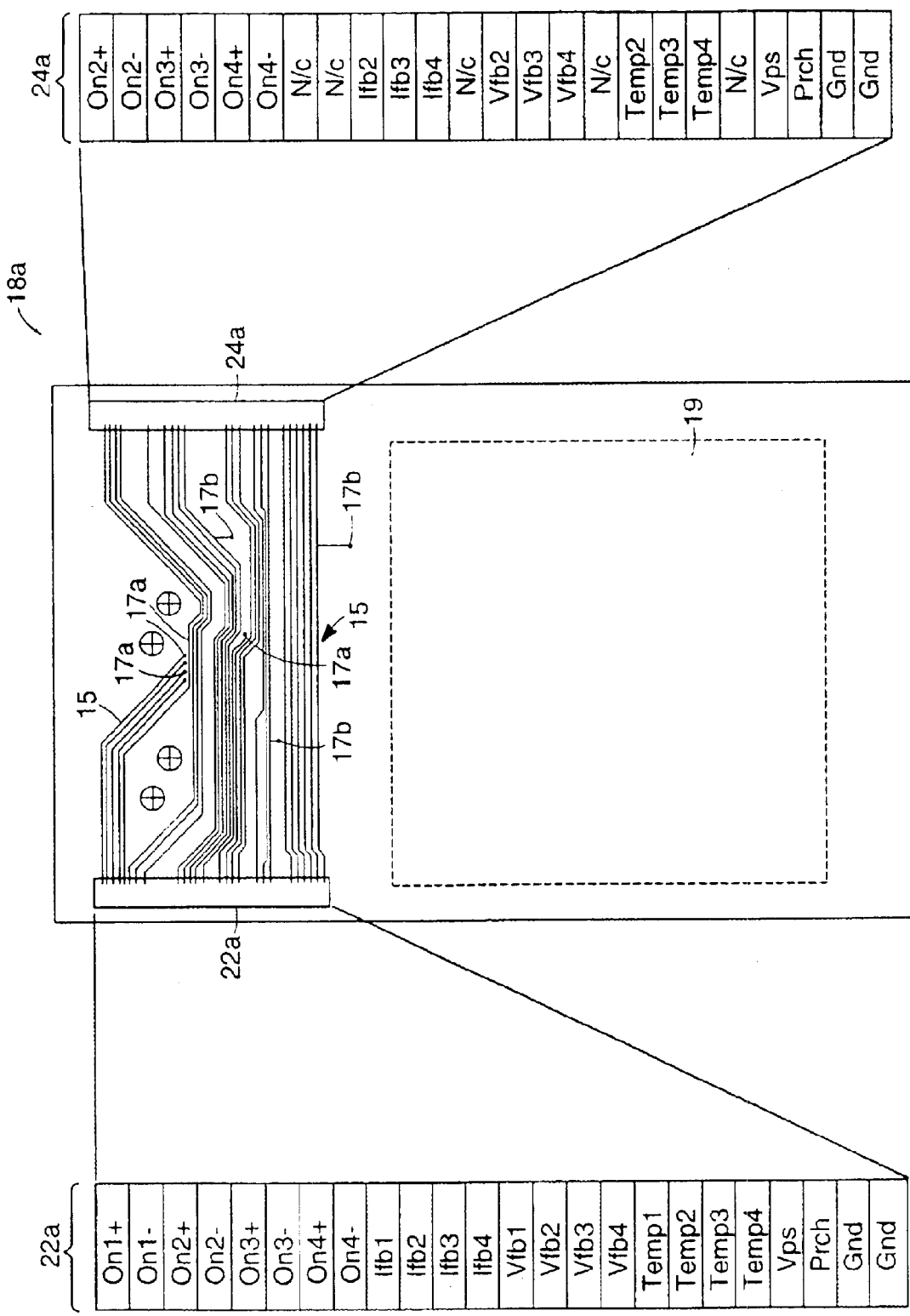
FIG. 2 is a schematic plan view of a first one of the interface printed circuit boards (PCBs) of the power interconnection system of FIG. 1.

Referring to FIG. 2, for example, interface PCB 18a includes an input connector 22a and output connector 24a. In this embodiment, each input connector 22a–22d and output connector 24a–24d includes twenty-four (24) terminals 26. Each of interface PCBs 18a–18d include other circuitry 19 for providing other functionality including, for example, power, logic and data signals to control PCB 14 or other external circuitry. As will be described below, although each of the input connectors and output connectors, as well as the cables that connect to them, are identical the control signals provided to each of the terminals are not the same. Using identical input connectors and output connectors is tremendously advantageous in facilitating assembly of systems that use the interconnecting scheme, thereby reducing cost and increasing reliability.

In general, each of power converter modules 16a–16d requires the following signals, common to all of the modules:

Precharge Control (Prch)

Logic Power (Vps)

Common (Gnd).

On the other hand, each power converter modules 16a–16d requires the following signals, unique to each of the modules:

Upper Gate Signal (On+)

Lower Gate Signal (On−)

Current Feedback (Ifb)

Voltage Feedback (Vbb)

Temperature (Temp)

Thus, cables 20a–20d, input connectors 22a–22d, and output connectors 24a–24d together serve the function of carrying these control signals from control PCB 14 to power converter modules 16a–16d.

For example, input connector 22a is mounted on PCB interface 18a of power converter module 16a. Input connector 22a includes terminals shown here in a row and representative of, from top to bottom, pairs of upper and lower gate signals (On+, On−) for each of the four power converter modules 16a–16d. The upper and lower gate signals are provided here, in numerical order followed by the current feedback signals (Ifb), voltage feedback signals (Vfb), and temperature (Temp) for each power converter module. In this embodiment, the last four terminals of input connector 22a are assigned the three common signals: precharge control (Prch), logic power (Vps), and common (Gnd) with the very last terminal in the row being a redundant Gnd signal. The control signals associated with power converter module 16a (i..e, On+, On−, Vfb1, Ifb1, and Temp1) are distributed appropriately to the devices and circuitry of power converter module 16a via conductive traces 15. Because these control signals are not required by the other of the power converter modules 16b–16d, the conductive traces associated with these signals extend only to termination contacts 17a. The Vps, Prch, and Gnd control signals, common to all of the power converter modules, have contacts 17b on PCB interface 18a, but extend as well to output connector 24a. The remaining signals are not used by power converter module 16a and, therefore, are forwarded to the remaining power converter modules 16b–16d via output connector 24a.

As was the case with input connector 22b, pairs of upper and lower gate signals (On+, On−) for each of the remaining three power converter modules 16a–16d (On2+, On2−, On3+, On3−, On4+, On4−) are provided in numerical order. However, because the upper and lower gate signals (On1+, On1−) are not required, the remaining gate signals are shifted up by one pair of terminals and the last pair of terminals associated with gate signals are not connected (designated N/c). Similarly, the current feedback signals (Ifb2, Ifb3, Ifb4) for the remaining three power converter modules 16b–16d are shifted and one terminal is left unconnected. The same arrangement of shifted signals followed by an unconnected terminal is used for the remaining voltage feedback signals (Vfb2, Vb3, Vfb4), and temperature (Temp2, Temp3, Temp4). As was the case with row 22a, the last four terminals of row 22b are assigned the three common signals: Prch, Vps, and Gnd.

Referring to FIG. 3A, input connector 22b and output connector 24b of power converter module 16b (the second of the power converter modules in the chain) are shown. Input connector 22b of interface PCB 18b is identical to output connector 24a of interface PCB 18a. However, output connector 24b of power converter module 16b uses the same pattern of shifting used for output connector 24a. Specifically, because the upper and lower gate signals (On1+, On1−, On2+, On2−) are not required for power converter module 16c, the remaining gate signals are shifted up by one additional pair of terminals and the last two pair of terminals associated with gate signals are not connected (designated N/c). Similarly, the current feedback signals (Ifb3, Ifb4) for the remaining pair of power converter modules 16c–16d are shifted and two terminals are left unconnected. The same arrangement of shifted signals followed by an unconnected terminal is used for the remaining voltage feedback signals (Vb3, Vfb4), and temperature signals (Temp3, Temp4). As was the case with input connector 22c, the last four terminals of row 28b are assigned the three common signals: Prch, Vps, and Gnd.

Referring to FIG. 3B, input connector 22c and output connector 24c of power converter module 16c (the second of the power converter modules in the chain) are shown. Input connector 22c of interface PCB 18c is identical to output connector 24b of interface PCB 18b. However, output connector 24c of power converter module 16c uses the same pattern of shifting used for output connector 24b. Specifically, the upper and lower gate signals (On1+, On1−, On2+, On2−, On3+, On3−) are not required for power converter module 16d. Thus, the remaining gate signals are shifted up by yet another pair of terminals and the last three pair of terminals associated with gate signals are not connected (designated N/c). Similarly, the current feedback signal (Ifb4) for the remaining power converter module 16d is shifted and three terminals are left unconnected. The same arrangement of shifted signals followed by an unconnected terminal is used for the remaining voltage feedback signal (Vfb4) and temperature signal (Temp4). As was the case with row 28a, the last four terminals of row 28b are assigned the three common signals: Prch, Vps, and Gnd.

In the above embodiment, power interconnection 10 was used to supply control signals to four power converter modules 12a–12d. It is important to appreciate that the concept of the invention is equally applicable to power supply systems having fewer as well as many more modules. It is also important to appreciate that although the input and output connectors in the above embodiment included were of the type having twenty-four (24) terminals, the invention is also applicable to connectors having fewer and greater terminals. Depending on the number of terminals required for conveying control signals, any one of a variety connectors or headers may be used. For example, protected headers having between 10 and 64 terminal pins are commercially available under the AMP line of Tyco Electronics.

A number of embodiments of the invention have been described. Nevertheless, it will be understood that various modifications may be made without departing from the spirit and scope of the invention. Accordingly, other embodiments are within the scope of the following claims.

What is claimed is:

1. An interconnection system for providing signals to a plurality of independently controllable electronic modules, the interconnection system comprising:
   a first plurality of connection terminals associated with each and every one of the plurality of electronic modules; and
   a second plurality of connection terminals associated with the plurality of electronic modules except a first one of the electronic modules, the second plurality of connection terminals electrically connected to the first plurality of connection terminals.

2. The interconnection system of claim 1 further comprising a third plurality of connection terminals associated with the plurality of electronic modules except the first one of the electronic modules and a second one of the electronic modules, the third plurality of connection terminals electrically connected to the second plurality of connection terminals.

3. The interconnection system of claim 2 further comprising a fourth plurality of connection terminals associated with the plurality of electronic modules except the first one of the electronic modules, the second one of the electronic modules, and a third one of the electronic modules, the fourth plurality of connection terminals electrically connected to the third plurality of connection terminals.

4. The interconnection system of claim 1 wherein:
   the first plurality of connection terminals includes:
      a first subset of connection terminals associated with the first one of the electronic modules and positioned at a first location on the first plurality of connection terminals;
      a second subset of connection terminals associated with a second one of the electronic modules and positioned at a second location on the first plurality of connection terminals; and
   the second plurality of connection terminals includes:
      a third subset of connection terminals associated with the second one of the electronic modules and positioned at a third location on the second plurality of connection terminals corresponding to the first location on the first plurality of connection terminals, the third subset of connection terminals electrically connected to the second subset of connection terminals.

5. The interconnection system of claim 4 further comprising a third plurality of connection terminals and wherein the second plurality of connection terminals further includes a fourth subset of connection terminals associated with a third one of the electronic modules and positioned at a fourth location on the second plurality of connection terminals; and
   the third plurality of connection terminals includes a fifth subset of connection terminals associated with the third one of the electronic modules and positioned at a fifth location on the third plurality of connection terminals corresponding to the fourth location on the second plurality of connection terminals, the fifth subset of connection terminals electrically connected to the fourth subset of connection terminals.

6. The interconnection system of claim 1 wherein the first plurality of connection terminals and the second plurality of connection terminals include connection terminals associated with a common ground signal, a precharge control signal and a logic power control signal.

7. The interconnection system of claim 6 wherein each of the first plurality of connection terminals of the second plurality of connection terminals includes an upper gate signal (On+), a lower gate signal (On−), a current feedback signal (Ifb), a voltage feedback signal (Vfb), and a temperature signal (Temp) associated with the first one of the electronic modules and the second one of the electronic modules, respectively.

8. An interconnection system for providing signals to a plurality of independently controllable electronic modules, the interconnection system comprising:
   a substrate including:
      a first plurality of connection terminals associated with each and every one of the plurality of independently controllable electronic modules;
      a second plurality of connection terminals associated with the plurality of independently controllable electronic modules except a first one of the electronic modules; and
      a plurality of conductive traces extending between the second plurality of connection terminals and the first plurality of connection terminals.

9. The interconnection system of claim 8 wherein:
   the first plurality of connection terminals includes:
      a first subset of connection terminals associated with the first one of the electronic modules and positioned at a first location on the first plurality of connection terminals;

a second subset of connection terminals associated with a second one of the electronic modules and positioned at a second location on the first plurality of connection terminals; and the second plurality of connection terminals includes:

a third subset of connection terminals associated with the second one of the electronic modules and positioned at a third location on the second plurality of connection terminals corresponding to the first location on the first plurality of connection terminals; and conductive traces extending between the third subset of connection terminals and the second subset of connection terminals.

10. An interconnection system for providing signals to a plurality of independently controllable electronic modules, the interconnection system comprising:

a first substrate associated with a first one of the plurality of independently controllable electronic modules, the first substrate including:

a first plurality of connection terminals for receiving control signals to control each and every one of the plurality of independently controllable electronic modules;

a second plurality of connection terminals for receiving control signals to control each of the plurality of independently controllable electronic modules except a first one of the electronic modules; and a plurality of conductive traces extending between the second plurality of connection terminals and the first plurality of connection terminals.

11. The interconnection system of claim 10 further comprising:

a second substrate associated with a second one of the plurality of independently controllable electronic modules, the second substrate including:

a third plurality of connection terminals for receiving control signals to control each of the plurality of independently controllable electronic modules except the first one of the electronic modules;

a fourth plurality of connection terminals for receiving control signals to control each of the plurality of independently controllable electronic modules except the first one of the electronic modules and a second one of the electronic modules; and second plurality of conductive traces extending between the fourth plurality of connection terminals and the third plurality of connection terminals.

12. A system comprising:

a plurality of independently controllable electronic modules, a first one of the independently controllable electronic modules including a first plurality of connection terminals and a second plurality of connection terminals, the second plurality of connection terminals associated with all but one of the plurality of independently controllable electronic modules and electrically connected to the first plurality of connection terminals.

13. The system of claim 12 wherein a second one of the independently controllable electronic modules includes a first plurality of connection terminals associated with all but one of the plurality of independently controllable electronic modules and a second plurality of connection terminals associated with all but two of the plurality of independently controllable electronic modules.

14. The system of claim 12 further comprising conductive traces which electrically connect the first plurality of connection terminals to the second plurality of connection terminals.

15. The system of claim 12 wherein:

the first plurality of connection terminals includes:

a first subset of connection terminals associated with the first one of the electronic modules and positioned at a first location on the first plurality of connection terminals;

a second subset of connection terminals associated with a second one of the electronic modules and positioned at a second location on the first plurality of connection terminals; and the second plurality of connection terminals includes:

a third subset of connection terminals associated with the second one of the electronic modules and positioned at a third location on the second plurality of connection terminals corresponding to the first location on the first plurality of connection terminals, the third subset of connection terminals electrically connected to the second subset of connection terminals.

16. A system for distributing control signals from a controller, the system comprising:

a chain of sequentially-connected independently controllable electronic modules, an initial one of the electronic modules including a first plurality of connection terminals adapted to receive the control signals from the controller, and a sequential one of the electronic modules including a second plurality of connection terminals configured to receive only a subset of the control signals.

17. The system of claim 16 wherein the subset of the control signals received by the second plurality of connection terminals include control signals for all but one of the independently controllable electronic modules.

* * * * *